US011384107B2

(12) United States Patent
Konno et al.

(10) Patent No.: US 11,384,107 B2
(45) Date of Patent: Jul. 12, 2022

(54) THERMOELECTRIC CONVERSION ELEMENT

(71) Applicant: JAPAN SCIENCE AND TECHNOLOGY AGENCY, Kawaguchi (JP)

(72) Inventors: Takumi Konno, Toyonaka (JP); Satoshi Yamashita, Toyonaka (JP); Yasuhiro Nakazawa, Toyonaka (JP); Nobuto Yoshinari, Toyonaka (JP)

(73) Assignee: JAPAN SCIENCE AND TECHNOLOGY AGENCY, Kawaguchi (JP)

(*) Notice: Subject to any disclaimer, the term of this patent is extended or adjusted under 35 U.S.C. 154(b) by 93 days.

(21) Appl. No.: 17/050,655

(22) PCT Filed: Apr. 26, 2019

(86) PCT No.: PCT/JP2019/017850
§ 371 (c)(1),
(2) Date: Dec. 17, 2020

(87) PCT Pub. No.: WO2019/208753
PCT Pub. Date: Oct. 31, 2019

(65) Prior Publication Data
US 2021/0115076 A1    Apr. 22, 2021

(30) Foreign Application Priority Data

Apr. 27, 2018 (JP) .............................. JP2018-086168

(51) Int. Cl.
*H01L 35/24* (2006.01)
*C07F 15/00* (2006.01)
(Continued)

(52) U.S. Cl.
CPC ............ *C07F 15/008* (2013.01); *F25B 21/02* (2013.01); *H01L 35/16* (2013.01); *H01L 35/22* (2013.01); *H01L 35/24* (2013.01)

(58) Field of Classification Search
CPC ... H01L 35/00–34; H01L 27/16; C07F 15/008
(Continued)

(56) References Cited

U.S. PATENT DOCUMENTS

2017/0279025 A1*  9/2017  Haraguchi .............. H01L 35/26
2019/0304635 A1   10/2019  Konno et al.
2019/0359642 A1   11/2019  Konno et al.

FOREIGN PATENT DOCUMENTS

JP    2002-100420 A    4/2002
JP    2003-282972 A    10/2003
(Continued)

OTHER PUBLICATIONS

STIC search result for U.S. Appl. No. 17/050,655 (Year: 2022).*
International Search Report dated Jul. 16, 2019 in PCT/JP2019/017850 filed on Apr. 26, 2019, 2 pages.

*Primary Examiner* — Bach T Dinh
(74) *Attorney, Agent, or Firm* — Oblon, McClelland, Maier & Neustadt, L.L.P.

(57) ABSTRACT

Provided is an easy-to-process thermoelectric conversion device whose shape can be freely changed. The device is provided containing electrodes and an ionic solid, wherein the ionic solid has: an anionic heterometal complex aggregated to form a crystal lattice; and a cationic species present in interstices of the crystal lattice, and wherein the anionic heterometal complex includes: a metal M1 selected from the group consisting of the elements of Groups 8, 9 and 10 of the Periodic Table and Cr and Mn; a metal M2 selected from the group consisting of the elements of Groups 11 and 12 of the Periodic Table; and a ligand.

13 Claims, 11 Drawing Sheets

MOLECULAR STRUCTURE OF [Rh₄Zn₄{L-cys}₁₂O]⁶⁻

PACKING STRUCTURE OF K₆[Rh₄Zn₄{L-cys}₁₂O]

(51) Int. Cl.
*F25B 21/02* (2006.01)
*H01L 35/16* (2006.01)
*H01L 35/22* (2006.01)

(58) Field of Classification Search
USPC .................................................. 136/200–242
See application file for complete search history.

(56) References Cited

FOREIGN PATENT DOCUMENTS

| | | |
|---|---|---|
| JP | 2005-075870 A | 3/2005 |
| JP | 2015-193572 A | 11/2015 |
| WO | WO 2018/056237 A1 | 3/2018 |
| WO | WO 2018/079831 A1 | 5/2018 |

* cited by examiner

THERMOELECTRIC CONVERSION ELEMENT

FIELD OF THE INVENTION

The present invention relates to a thermoelectric conversion device comprising an ion-flow-type ionic solid.

BACKGROUND OF THE INVENTION

Peltier devices are widely used as all-solid-state thermoelectric conversion materials. The Peltier device is a member in which metal electrodes and semiconductors are alternately laminated typically in an n-shape, and passage of a direct current through the device causes absorption of heat between a metal electrode and a semiconductor, and generation of heat on the opposite side. There is the advantage that the apparatus has a small volume, and thus contributes to ease of downsizing an apparatus, and noises and vibrations are not generated. Therefore, such devices are used for cooling CPUs of computers and for small cold chambers mounted in vehicles etc., medical cooling apparatuses and the like.

However, the electrode of the Peltier device is a metallic material, and hence a good conductor of electricity, and is required to be covered with an insulator when used as a component in practice. Further, the carrier of heat is electrons, and production of a sufficient temperature gradient requires passage of a large amount of current (Patent Literature 1).

In the first place, the operating principle of the Peltier device is based on a temperature difference caused by passage of electrons through two metals having different energy levels. Thus, insulation of the device itself and design of a Peltier device which does not require a large amount of current are extremely difficult, and in fact, such a device is not known. Further, it is difficult to freely process the Peltier device in view of the structure thereof.

A solution Dufour effect is known as a technique for producing a temperature gradient without consideration of mechanical elements outside the system and a heat source by a method similar to that for the Peltier device. The Dufour effect is an effect such that when a concentration gradient is present in the system, heat is generated on a high-concentration side. However, in the Dufour effect, a solution is used as a mediator, and it is difficult to apply such a technique to the Peltier device.

CITATION LIST

Patent Literature

Patent Literature 1: JP-A-2003-282972

SUMMARY OF THE INVENTION

Technical Problem

Downsizing and weight saving of electronic equipment are rapidly progressing. A device which can be used without being insulated and is capable of efficiently performing thermoelectric conversion without using a large amount of electric power has not been put into practice.

The present invention provides a device which is itself formed of an insulating material and which generates heat to produce a temperature gradient.

The present invention provides an easy-to-process thermoelectric conversion device whose shape can be freely changed.

Solution to Problem

The present inventors produced various metal complexes, and examined the properties and functions thereof, and resultantly found that an ionic solid having an anionic heterometal complex aggregated to form a crystal lattice and a cationic species present in interstices of the crystal lattice is stable to moisture and humidity, the cationic species exhibits a high kinetic property, the ionic solid exhibits an extremely high metal ion conductivity even in the form of a molding material of practical use such as a pellet, and a temperature gradient is produced when an electric field is applied. In this way, the present invention was completed.

That is, the present invention provides the following items [1] to [12].

[1] A device comprising electrodes and an ionic solid, wherein the ionic solid comprises: an anionic heterometal complex aggregated to form a crystal lattice; and a cationic species present in interstices of the crystal lattice, and wherein the anionic heterometal complex comprises: a metal M1 selected from the group consisting of the elements of Groups 8, 9 and 10 of the Periodic Table and Cr and Mn; a metal M2 selected from the group consisting of the elements of Groups 11 and 12 of the Periodic Table; and a ligand.

[2] The device according to [1], wherein the metal M1 of Group 8, 9 or 10 of the Periodic Table is one selected from the group consisting of Fe, Ru, Os, Rh, Co, Pd, Ir and Pt.

[3] The device according to [1] or [2], wherein the metal M2 is Zn, Cd, Hg, Au, Ag or Cu.

[4] The device according to any one of [1] to [3], wherein the ionic solid is an ionic solid represented by the formula (1):

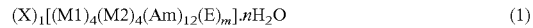

$$(X)_l[(M1)_4(M2)_4(Am)_{12}(E)_m]\cdot nH_2O \qquad (1)$$

wherein M1 represents Fe, Ru, Os, Rh, Co, Pd, Ir, Pt, Cr or Mn;
M2 represents Zn, Cd, Hg, Au, Ag or Cu;
X represents a cation;
Am represents an amino acid;
E represents $O^{2-}$, $S^{2-}$, $Se^{2-}$, $Te^{2-}$, $F^-$, $Cl^-$, $Br^-$, $I^-$ or $H^-$;
l represents a number which gives a value of from 4 to 14 when multiplied by the ionic valency of X;
m represents a number of 0 or 1; and
n represents a number of from 1 to 100.

[5] The device according to [4], wherein the anionic heterometal complex in the formula (1) is a complex represented by the formula (2):

$$[(M1)_4(M2)_4(Am)_{12}(E)_m]^{l-} \qquad (2)$$

wherein M1 represents Fe, Ru, Os, Rh, Co, Pd, Ir, Pt, Cr or Mn;
M2 represents Zn, Cd, Hg, Ag or Cu;
Am represents an amino acid;
E represents $O^{2-}$, $S^{2-}$, $Se^{2-}$, $Te^{2-}$, $F^-$, $Cl^-$, $Br^-$, $I^-$ or $H^-$;
l represents a number which gives a value of from 4 to 14 when multiplied by the ionic valency of X in the formula (1); and
m represents a number of 0 or 1.

[6] The device according to [4] or [5], wherein Am is an amino acid having a thiol group.

[7] The device according to any one of [4] to [6], wherein X is a cation of a metal belonging to Group 1 or Group 2.

[8] The device according to any one of [4] to [7], wherein M1 represents Rh or Co, and M2 represents Ag or Zn.

[9] The device according to any one of [4] to [8], wherein Am is an amino acid selected from the group consisting of cysteine, penicillamine and homocysteine.

[10] The device according to any one of [1] to [9], wherein the device is an electrothermal device.

[11] The device according to any one of [1] to [10], wherein the device is one in which when a potential difference is applied to the device, a flowable ion concentration gradient is generated in the ionic solid, resulting in generation of a temperature distribution in the ionic solid.

[12] The device according to any one of [1] to [10], wherein the device is one in which when a change in amount of heat is applied to the device, a flowable ion concentration gradient is generated in the ionic solid, resulting in generation of a potential difference in the ionic solid.

[13] A method comprising passing a current through the device of any one of [1] to [10], generating a concentration gradient in the ionic solid of the device, and generating heat in the ionic solid of the device.

Advantageous Effects of the Invention

It was found that by applying a voltage to an ion-flow-type ionic solid according to the present invention, flowable ions (cations) in a crystal or a pellet are eccentrically located, and on the positive electrode side where the number of cations decreases, the resistance increases, resulting in generation of Joule heat, and that a temperature gradient derived from a concentration gradient similarly to the solution Dufour effect is generated even in a solid. The device of the present invention can be used without being insulated, and is capable of efficiently performing thermoelectric conversion without using a large amount of electric power. The present invention provides an easy-to-process thermoelectric conversion device whose shape can be freely changed.

DETAILED DESCRIPTION OF THE INVENTION

Figure 1:
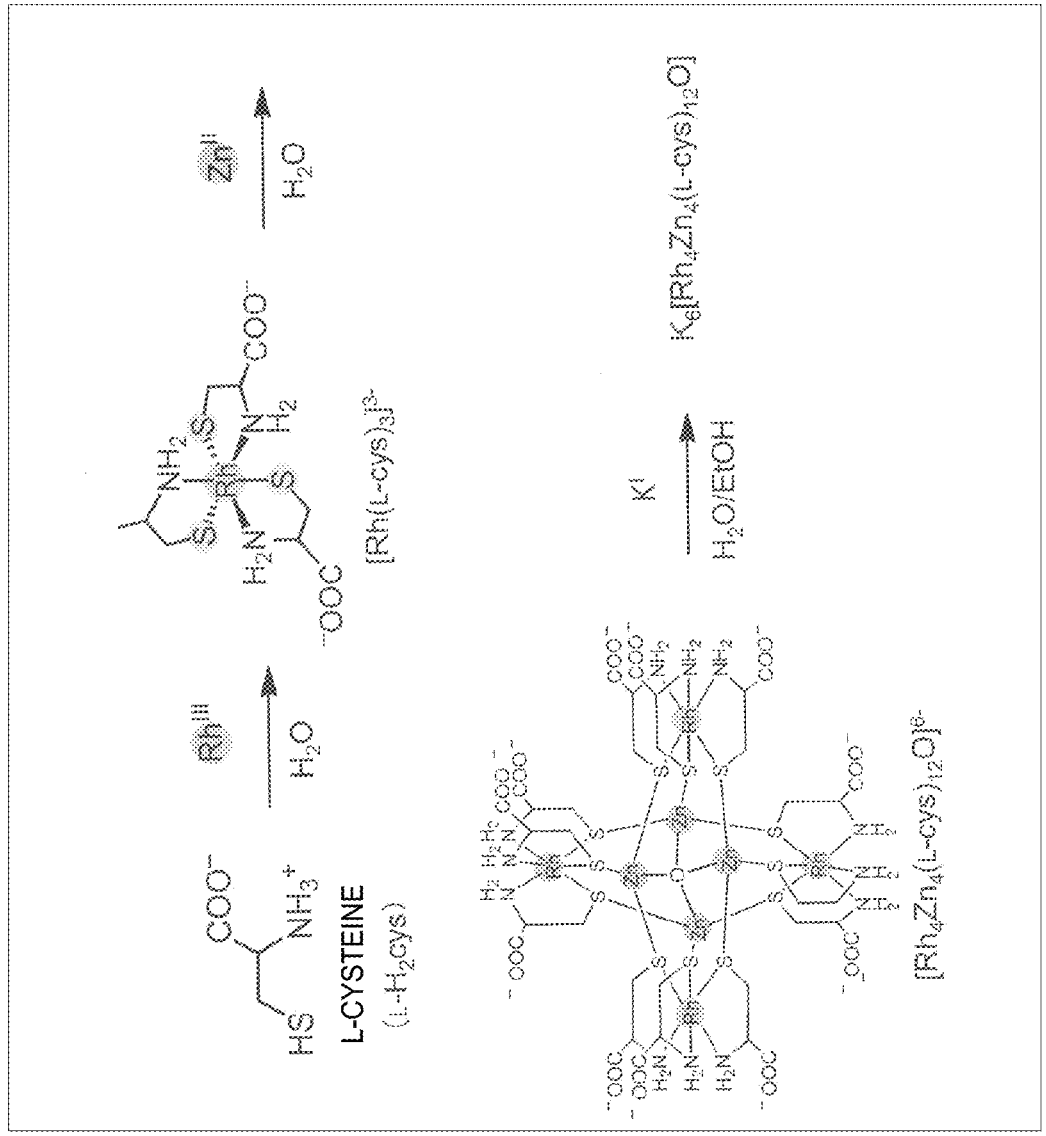
FIG. 1 shows a reaction in Example 1.

A device of the present invention comprises electrodes and an ionic solid, wherein the ionic solid has: an anionic heterometal complex aggregated to form a crystal lattice; and a cationic species present in interstices of the crystal lattice, and wherein the anionic heterometal complex includes: a metal M1 selected from the group consisting of the elements of Groups 8, 9 and 10 of the Periodic Table and Cr and Mn; a metal M2 selected from the group consisting of the elements of Groups 11 and 12 of the Periodic Table; and a ligand.

(Ionic Solid)

The ionic solid according to the present invention has: an anionic heterometal complex forming a crystal lattice; and a cationic species present in interstices of the crystal lattice. The presence of the cationic species in interstices of the crystal lattice refers to a state in which the anionic heterometal complex is confined to a specific position at which the crystal lattice is formed, whereas the cationic species is present at a free position in interstices of the crystal lattice. In this specification, such an ionic solid is sometimes referred to as an "ion-flowable ionic solid" or an "ion-flow-type ionic solid". When an electric field is applied to the ionic solid according to the present invention, the cationic species can move through the ionic solid, and therefore the cationic species has ion flowability. Water molecules are also present in interstices of the crystal lattice.

The ionic solid according to the present invention can be formed into a molding material such as a pellet without being heated.

When an electric field is applied to the ionic solid according to the present invention, cations are transported through the solid into the material by the electric field, and resultantly, a concentration gradient is generated, so that chemical equilibrium is collapsed, leading to generation of a temperature gradient. Hereinafter, this phenomenon is referred to as a Dufour effect. A phenomenon is known in which a concentration gradient is generated, resulting in generation of a potential, and this phenomenon is a Seebeck effect.

Generation of Dufour effect heat occurs on the negative electrode side where the concentration of cations increases.

On the other hand, when an electric field is applied to the ionic solid according to the present invention, cations are transported through the solid into the material by the electric field, a concentration gradient is generated, and thus the concentration of cations on the positive electrode side decreases, so that the resistance on the positive electrode side becomes markedly high relative to the resistance on the negative electrode side, leading to generation of a large amount of Joule heat on the positive electrode side.

On both the negative electrode side and the positive electrode side, the electric resistance value is lower than that in a low-voltage region in a high-voltage-applied state, and is quasi-equivalent to the electric resistance value of a series circuit of a low-resistance circuit and a high-resistance circuit because the resistance on the negative electrode side and the resistance on the positive electrode side differ by orders of magnitude in a voltage-applied state. Therefore, the amount of heat generated on the high-resistance circuit side is markedly large.

Thus, when a voltage is applied, the ionic solid according to the present invention can obtain two types of heat: Dufour effect heat and Joule heat. Generation of these two types of heat can be controlled.

In a typical ion crystal, a cationic species is close in ion size to an anionic species, and therefore coulombic attraction effectively acts, so that the positions of the cationic species and anionic species are completely fixed. Thus, either the cationic species or the anionic species cannot move. Therefore, the ion crystals have no flowability. On the other hand, in the ionic solid according to the present invention, the high kinetic property of a cationic species can be secured by the approaches described below.

First, by using an anionic species having a large ion size, the surface charge density of the anionic species is decreased to reduce coulombic attraction between cations and anions.

Second, water molecules are incorporated into the structure so that the water molecules get in between cations and anions to reduce coulombic attraction due to the high dielectric constant of water.

Third, a substituent advantageous to non-coulombic interaction (e.g. amino group or carboxy group capable of forming a hydrogen bond) is disposed in an anionic heterometal complex, so that anionic complexes are mutually connected to form a limitlessly extending "passage" necessary for the motion of the cationic species. In particular, it is preferable to use a complex anion having a substantially spherical structure because a passage which is not collapsed even by external pressure is spontaneously formed between adjacent complex anions. Accordingly, the ionic solid according to the present invention can also be formed into a pellet. It is considered that since cations flow through the "passage" formed by the anionic heterometal complex, the high kinetic property of the cationic species can be secured even when the ionic solid is formed into a pellet.

The size of the "passage" depends on the diameter of the anionic heterometal complex for use in the present invention. While it is necessary to consider the size of flowing cationic ions, it is preferable to use an anionic heterometal complex having a diameter of at least 1.5 nm or more, preferably 2 nm or more, for forming a "passage" having properties meeting the present invention.

The ionic solid according to the present invention is represented by, for example, the following formula (1):

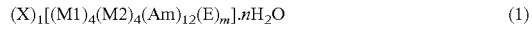
$$(X)_l[(M1)_4(M2)_4(Am)_{12}(E)_m]\cdot nH_2O \quad (1)$$

wherein M1 represents Fe, Ru, Os, Rh, Co, Pd, Ir, Pt, Cr or Mn;
M2 represents Zn, Cd, Hg, Au, Ag or Cu;
X represents a cation;
Am represents an amino acid;
E represents $O^{2-}$, $S^{2-}$, $Se^{2-}$, $Te^{2-}$, $F^-$, $Cl^-$, $I^-$ or $H^-$;
l represents a number which gives a value of from 4 to 14 when multiplied by the ionic valency of X;
m represents a number of 0 or 1; and
n represents a number of from 1 to 100.

The anionic heterometal complex of the ionic solid according to the present invention is represented by the formula (2):

$$[(M1)_4(M2)_4(Am)_{12}(E)_m]^{l-} \quad (2)$$

wherein M1, M2, Am, E, l and m are as described above.
X represents a cation. X normally represents a metal cation, and may be a cation of a typical metal or any of transition metals including lanthanoids. In particular, a cation of a metal belonging to Group 1 or Group 2 is preferable. Specific examples of the typical metal represented by X include $Li^+$, $Na^+$, $K^+$, $Rb^+$, $Cs^+$, $Be^{2+}$, $Mg^{2+}$, $Ca^{2+}$, $Sr^{2+}$, $Ba^{2+}$ and $Ra^{2+}$, and $Na^+$, $K^+$, $Rb^+$, $Cs^+$, $Mg^{2+}$, $Ca^{2+}$, $Sr^{2+}$ and $Ba^{2+}$ are more preferable. These cationic species are advantageous from the viewpoint of ion flowability because of small electrostatic interaction with the anionic heterometal complex. On the other hand, for obtaining an efficient Dufour effect, cations large in size with respect to the passage are preferable, and examples of such cations include $K^+$, $Rb^+$, $Cs^+$, $Ca^{2+}$, $Sr^{2+}$ and $Ba^{2+}$, and $K^+$ is most preferable.

The present inventors believe that in the ionic solid according to the present invention, a reaction takes place in which cations form coordination bonds with water or carboxy groups disposed on the periphery of complex anions, these coordination bonds are broken, and ions move, and such a reaction is a rate-controlling step for a mechanism representing ion flowability. A sufficiently high exchange rate of the coordination bonds between cations and water or carboxylate groups leads to a high moving rate. From such a viewpoint, monovalent cations of alkali metals such as potassium and sodium are more preferable.

l represents a number which gives a value of from 4 to 14 when multiplied by the ionic valency of X. For example, when X is a Group 1 metal ion, l represents a number of from 4 to 14. When X is a Group 2 metal ion, l represents a number of from 2 to 7. An ionic product of from 4 to 14 is advantageous because of a large amount of kinetic charge.

M1 is preferably Co or Rh, more preferably Rh, from the viewpoint of chemical stability. M2 is preferably Ag, Cu or Zn, more preferably Ag or Zn, still more preferably Ag, from the viewpoint of strength of a chemical bond with a sulfur atom.

The above-described metals have an effect on stability of the anionic heterometal complex. In particular, a combination of metals M1 and M2 is preferable from the viewpoint of increasing the number of nuclei, i.e. the size, of the anionic heterometal complex.

Am represents a ligand which coordinates to M1 and M2 to form a stable anionic heterometal complex. As the ligand, a known ligand can be used. Crosslinking-type functional groups such as a hydroxy group, an imidazole group and a carboxy group do not necessarily form a strong metal-ligand bond in water, and therefore when such functional groups are used, caution should be taken so as not to impair the effects of the present invention. A ligand which forms a complex having a cyclic structure is preferable from the viewpoint of stability. In particular, presence of a thiol group capable of stably forming the metal-ligand bond in water is preferable, and an amino acid having a thiol group is more preferable. There is no limitation on the relative position of the amino group and the carboxyl group, and the ligand is not limited to an α-amino acid, and may have a carboxyl group at the so-called ω position. A configuration is preferable in which the amino group and the thiol group form a chelate structure with the metal. A configuration is more preferable in which the amino group and the thiol group are present at the β-position or the γ-position of the carboxyl group. Specifically, such an amino acid is preferably cysteine, penicillamine or homocysteine, more preferably cysteine or penicillamine.

E is an anion, and represents $O^{2-}$, $S^{2-}$, $Se^{2-}$, $Te^{2-}$, $F^-$, $Cl^-$, $Br^-$, $I^-$ or $H^-$. E is more preferably $O^{2-}$, $S^{2-}$, $Cl^-$ or $Br^-$, still more preferably $O^{2-}$ or $S^{2-}$. m represents a number of 0 or 1, and E is not present when m is 0. Presence of E is intended to provide stability by satisfying the coordination sphere of metal ions which form the anionic heterometal complex.

n represents a number of from 1 to 100. n is preferably from 1 to 80, more preferably from 20 to 80, still more preferably from 30 to 60. n corresponds to an amount of a medium allowing X (cationic species), and is adjusted by the type of anionic ligand and the type of cationic species so that flowability is enhanced. n can be regulated by the temperature, the time or the like for an isolation operation after formation of the complex.

Examples of preferred combinations of M1 and M2 include combinations of Rh and Ag, Co and Zn, Co and Ag, and Rh and Cu, and combinations of Rh and Ag, Co and Zn, and Co and Ag are more preferable. In these combinations, contamination between M1 and M2 does not occur, and a stable anionic heterometal complex can be formed.

Specific examples of the ionic solid according to the present invention include the following:

$(X)_1[(Rh)_4(Ag)_4(cys)_{12}] \cdot nH_2O$, $(X)_1[(Co)_4(Zn)_4(cys)_{12}O] \cdot nH_2O$, $(X)_1[(Co)_4(Ag)_4(cys)_{12}] \cdot nH_2O$, $(X)_1[(Rh)_4(Zn)_4(cys)_{12}] \cdot nH_2O$, (x, 1 and n are as described above). Further specific examples thereof include the following ionic solids:

$Li_8[(Rh)_4(Ag)_4(L-cys)_{12}] \cdot nH_2O$,
$Na_8[(Rh)_4(Ag)_4(L-cys)_{12}] \cdot nH_2O$,
$K_6[(Co)_4(Zn)_4(L-cys)_{12}O] \cdot nH_2O$,
$K_8[(Rh)_4(Ag)_4(L-cys)_{12}] \cdot nH_2O$,
$Rb_8[(Rh)_4(Ag)_4(L-cys)_{12}] \cdot nH_2O$,
$Cs_8[(Rh)_4(Ag)_4(L-cys)_{12}] \cdot nH_2O$,
$Mg_4[(Rh)_4(Ag)_4(L-cys)_{12}] \cdot nH_2O$,
$Ca_4[(Rh)_4(Ag)_4(L-cys)_{12}] \cdot nH_2O$, and
$Ba_4[(Rh)_4(Ag)_4(L-cys)_{12}] \cdot nH_2O$.

Figure 2:
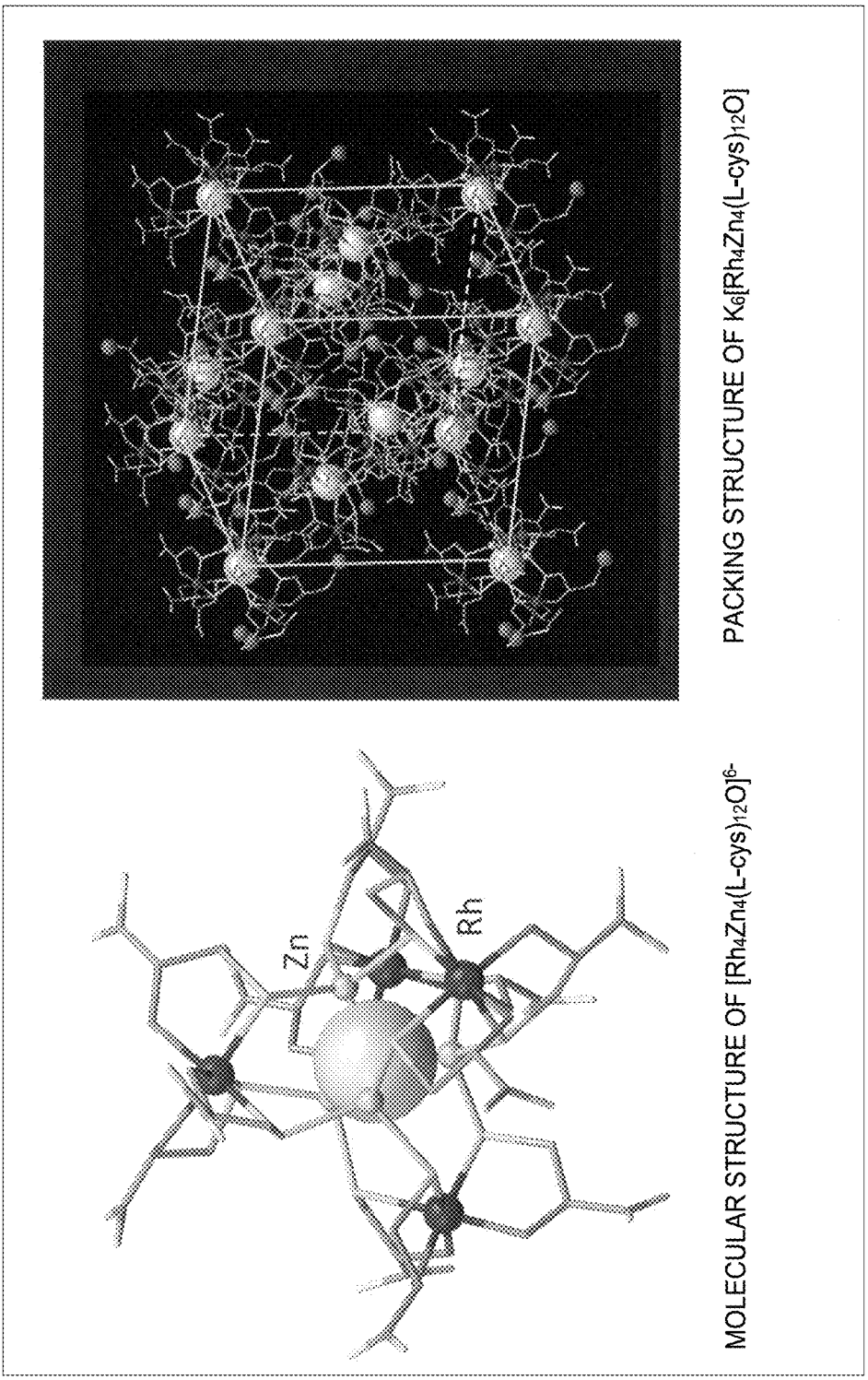
FIG. 2 shows a crystal structure of an ionic solid obtained from Example 1.

In the ionic solid according to the present invention, three species: M1, M2 and Am coordinate at a ratio of 4:4:12. More specifically, as shown in FIG. 1, three Am molecules coordinate to one M1 molecule, and M2 reacts therewith to form a structure of M1:M2:Am=4:4:12. In some cases, one E is present at the center of four M2s. The ionic solid (1) has a crystal structure as shown in FIG. 2.

That is, the ionic solid according to the present invention is an ion-flow-type ionic solid in which the cationic species ((X)l) flows through interstices of a crystal lattice formed by the anionic heterometal complex $[(M1)_4(M2)_4(Am)_{12}=(E)_m]$ under a non-coulombic force, which is different from ionic solids present in nature. Preferably, water molecules are present in the interstices of the crystal lattice.

The size of the crystal lattice formed by the anionic metal complex is typically from 1 to 10 nm, preferably from 2 to 6 nm, still more preferably from 2 to 3 nm.

(Production of Ionic Solid)

The ionic solid (1) can be produced by, for example, reacting the amino acid (Am) with the metal M1, then reacting the metal M2, and then reacting the cation (X).

The reaction of M1 with the amino acid can be carried out by, for example, stirring M1 and the amino acid in a solvent such as a basic aqueous solution. From this reaction, $M1(Am)_3$ is obtained. The reaction of $M1(Am)_3$ with M2 can be carried out, for example, under stirring in a solvent such as water or a acetic acid/potassium acetate buffer solution. Next, the reaction of the resulting compound with the cation is carried out by adding an inorganic salt of the cation, etc. in water.

The operation for isolating the resulting ionic solid (1) is carried out by, for example, adding ethanol/methanol or the like or adding a large excessive amount of a cationic salt, and leaving the mixture to stand in a cold and dark place.

(Electrode)

The electrode according to the present invention is preferably one that is inactive against water molecules in the ionic solid, and may be easily bonded to the ionic solid. As such an electrode, a platinum electrode, a paste electrode obtained using gold and carbon, or a mesh electrode is used.

(Device)

The device of the present invention is formed by bonding the ionic solid to the electrode. The electrode may be placed on a surface of a single crystal or a pellet of the ionic solid, or placed inside the ionic solid.

When a potential difference is applied to the device of the present invention, a concentration gradient of flowable ions is generated in the ionic solid, resulting in generation of a temperature distribution in the ionic solid. When a change in amount of heat is applied to the device of the present invention, a concentration gradient of flowable ions is generated in the ionic solid, resulting in generation of a potential difference in the ionic solid.

Therefore, the device of the present invention is extremely useful as a device for exchanging amount of heat.

The outstanding characteristic of the Seebeck effect of the device of the present invention is that it is obtained even at room temperature unlike in the case of metal, and the Seebeck coefficient at room temperature (from 15 to 30° C.) is from 0.3 mV/K to 1.3 mV/K.

When a current passes through the device of the present invention, a concentration gradient is generated in the ionic solid of the device, so that heat can be generated. Such a heat generation phenomenon can be applied as a thermo-module such as a temperature control module at the tip of a nozzle of an inkjet printer which requires localized heating.

When media at different temperatures are brought into contact with both ends of the device of the present invention, a potential difference is generated, so that a current can be extracted. Thus, the device can also be applied as a power generation module using exhaust heat as a heat source.

Generation of heat by application of a voltage to the device of the present invention has humidity dependency. Therefore, the device of the present invention can be applied to a humidity sensor, a humidity-sensitive switch or the like.

EXAMPLES

The present invention will now be described in more detail by way of Examples.

Example 1

(Production of Ionic Solid)

$K_6[Zn_4O[Rh (l-cys)_3]_4] \cdot nH_2O$

This substance was synthesized by the method described in Inorg. Chem. 1994, 33, 538-544 (FIG. 1). 200 mg of $\Delta$-$H_3[Rh(l-cys)_3]$ was suspended in 10 mL of water, 370 mg of ZnO and 210 mg of $ZnBr_2$ were added thereto, and a 1 M KOH aqueous solution was added to a pH of 9 to obtain a yellow solution. The solution was concentrated to a small amount with a rotary evaporator, and left standing in a refrigerator for 2 days to obtain a desired substance as a yellow crystal. The isolation yield was 451. $\Delta$-$H_3[Rh(l-cys)_3]$ is synthesized by the method described in Bull. Chem. Soc. Jpn. 1990, 63, 792 or Inorg. Chem. 1994, 33, 538-544. FIG. 2 shows a crystal structure of the obtained ionic solid.

The following ionic solids were synthesized through the same process. These ionic solids were confirmed to have the same crystal structure as in FIG. 2.

$Li_8[(Rh)_4(Ag)_4(L\text{-}cys)_{12}].nH_2O$, $Na_8[(Rh)_4(Ag)_4(L\text{-}cys)_{12}].nH_2O$, $K_6[(Co)_4(Zn)_4(L\text{-}cys)_{12}O].nH_2O, K_3[(Rh)_4(Ag)_4(L\text{-}cys)_{12}].nH_2O$, $Rb_8[(Rh)_4(Ag)_4(L\text{-}cys)_{12}].nH_2O$, $Cs_8[(Rh)_4(Ag)_4(L\text{-}cys)_{12}].nH_2O$, $Mg_4[(Rh)_4(Ag)_4(L\text{-}cys)_{12}].nH_2O$, $Ca_4[(Rh)_4(Ag)_4(L\text{-}cys)_{12}].nH_2O$ and $Ba_4[(Rh)_4(Ag)_4(L\text{-}cys)_{12}].nH_2O$.

(Method for Preparing Pellet with Electrodes)

A jig obtained by boring a ϕ1.5 mm hole at the center of a material with a hardness of 10 and a ϕ1.5 mm pushing bar made of High Speed Steel were provided, and about 10 mg of a fine crystal of an ion-flow-type ionic solid ($K_6[Zn_4O[Rh(L\text{-}cys)_3]_4].nH_2O$) was pressed against the jig with the pushing bar from the upper side and the lower side to prepare a pellet. The effective pressure applied to the sample was a maximum of from 1.2 to 1.3 GPa. In preparation of the pellet, pressure was applied up to about 0.3 GPa from normal pressure for about 20 minutes for removal of air, the pressure was then increased by 0.1 GPa every about 5 minutes, the sample was held at the maximum pressure for about 20 minutes, and then taken out, and wiring work was carried out. For a single crystal, a single crystal sample of a K salt was taken out from the mother liquid, the crystal was then washed with a small amount of a solution of water and EtOH at 1:1, an excess liquid was then immediately removed on a glass substrate, and wiring work was then carried out. For the wiring work, a ϕ20 μm gold wire was used, and DOTITE XC-12 and D-550 manufactured by Fujikura Kasei Co. Ltd. were used as paste. The paste was appropriately diluted with diethyl succinate before use for maintaining a good contact state.

(Voltage Application Experiment)

A direct-current power-supply apparatus was connected to the pellet with electrodes, and the voltage was raised from 0 V to 20 V at a rate of 1.25 V/sec. The sample was held for about 7 seconds, the applied voltage was then set back to 0 V, and the sample was held for about 15 seconds. An inverse voltage was similarly applied up to 25 V. During the process, the temperature of the entire pellet was observed with a thermography (Microscope Thermography Thermal View X manufactured by View Ohre Imaging Co., Ltd.).

Figure 3:
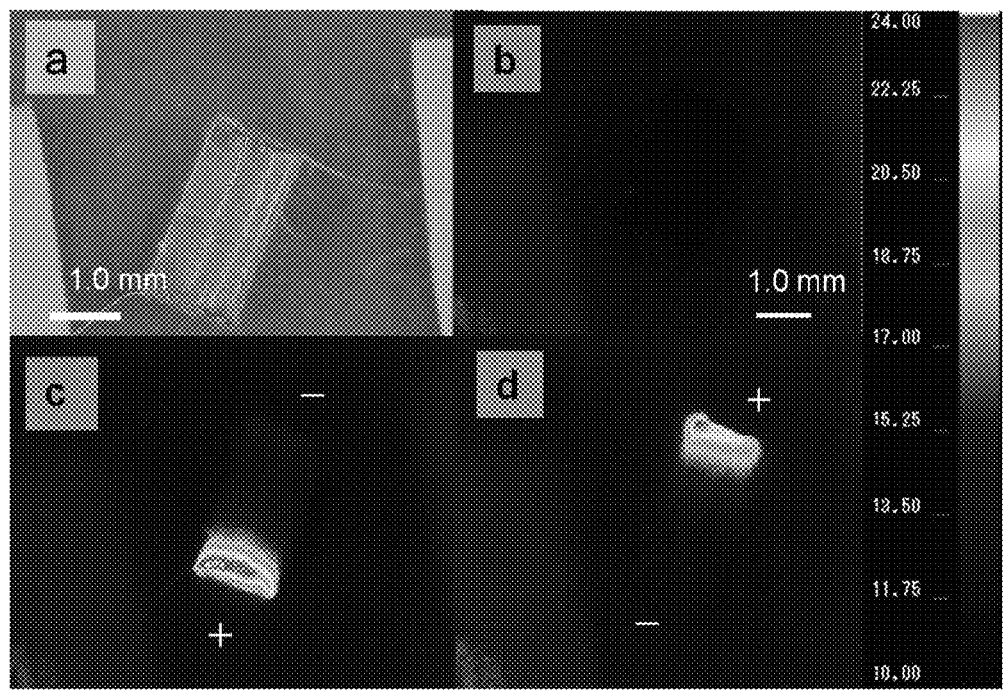
FIG. 3 shows an optical photograph of a pellet with electrodes, and typical images of the observed thermography ((a): pellet with electrode (device) and (b) to (d): observed thermography, where (b): before application of voltage, (c): during application of voltage (20 V) and (d): during application of an inverse voltage (25 V)).
Figure 4:
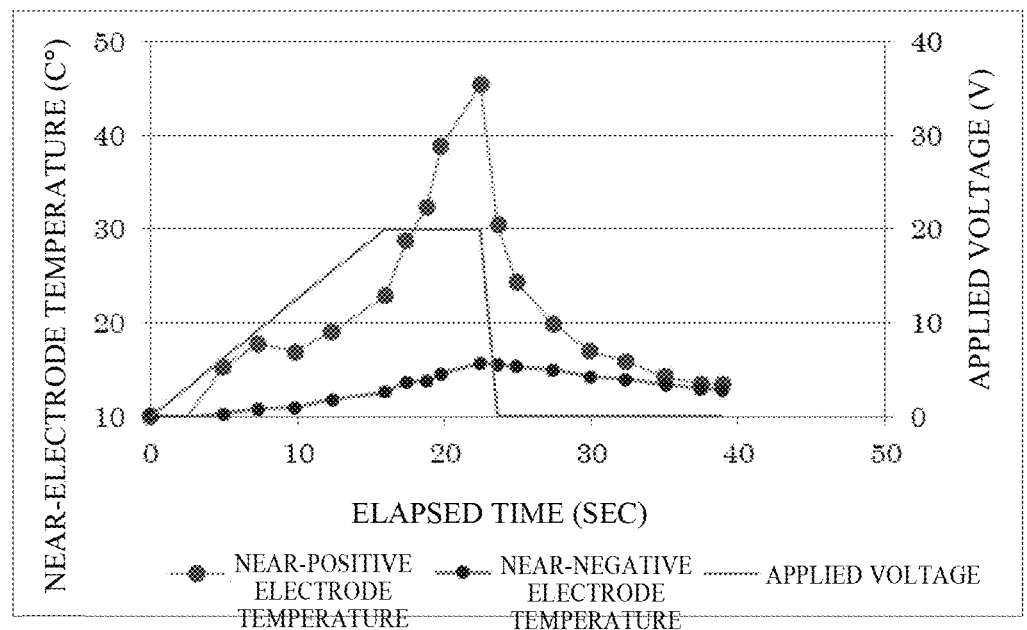
FIG. 4 shows a relationship between an applied voltage and a near-electrode temperature in the pellet with electrodes (device) (near-electrode temperature: temperature of an area within about 0.5 mm from the electrode)

FIG. 3 shows optical photographs of the pellet with electrodes, and selected and attached typical images of the observed thermography. FIG. 4 shows the plotted applied voltage and near-electrode temperature of the electrode over a process until the pellet was held for about 10 seconds after the applied voltage was set back to 0 V after the start of application of the voltage.

Example 2

An ion-flow-type ionic solid ($Cs_6[Zn_4O[Rh(L\text{-}cys)_3]_4].nH_2O$) (hereinafter, referred to as a Cs salt single crystal sample) was taken out from a mother liquid, the crystal was then washed with a small amount of a solution of water and EtOH at 1:1, an excess liquid was then immediately removed on a glass substrate, and wiring work was then carried out. For the wiring work, a ϕ20 μm gold wire was used, and DOTITE XC-12 and D-550 manufactured by Fujikura Kasei Co. Ltd. were used as paste. The paste was appropriately diluted with diethyl succinate before use for maintaining a good contact state. (Voltage application experiment) A direct-current power-supply apparatus was connected to the pellet with electrodes, and the voltage was raised from 0 V to 30 V at a rate of 5 V/sec. The sample was held for about 7 seconds, the applied voltage was then set back to 0 V, and the sample was held for about 15 seconds. An inverse voltage was similarly applied up to 30 V. During the process, the temperature of the entire pellet was observed with a thermography (Microscope Thermography Thermal View X manufactured by View Ohre Imaging Co., Ltd.). Here, a clear temperature gradient was formed although the temperature gradient was smaller than that for the K salt because the crystal size was small.

Example 3

A jig obtained by boring a ϕ1.5 mm hole at the center of a material with a hardness of 10 and a ϕ1.5 mm pushing bar made of High Speed Steel were provided, and a total of about 10 mg of ion-flow-type ionic solids (8 mg of ($Li_6[Zn_4O[Rh(L\text{-}cys)_3]_4].nH_2O$) (hereinafter, referred to as a Li salt fine crystal) and 2 mg of ($K_6[Zn_4O[Rh(L\text{-}cys)_3]_4].nH_2O$) (hereinafter, referred to as a K salt fine crystal)) were pressed against the jig with the pushing bar from the upper side and the lower side to prepare a pellet. The effective pressure applied to the sample was a maximum of from 1.0 to 1.1 GPa. In preparation of the pellet, pressure was applied up to about 0.3 GPa from normal pressure for about 20 minutes for removal of air, the pressure was then increased by 0.1 GPa every about 5 minutes, the sample was held at the maximum pressure for about 20 minutes, and then taken out, and wiring work was carried out. For the wiring work, a ϕ20 m gold wire was used, and DOTITE XC-12 and D-550 manufactured by Fujikura Kasei Co. Ltd. were used as paste. The paste was appropriately diluted with diethyl succinate before use for maintaining a good contact state. (Voltage application experiment) A direct-current power-supply apparatus was connected to the pellet with electrodes, and the voltage was raised from 0 V to 70 V at a rate of 10 V/sec. The sample was held for about 7 seconds, the applied voltage was then set back to 0 V, and the sample was held for about 15 seconds. An inverse voltage was similarly applied up to 70 V, and the sample was observed with a thermography. The result showed that a temperature difference was formed, but the temperature difference was a tenth of that for the K salt. The state of formation of the temperature difference varied depending on the voltage application time.

Example 4

A jig obtained by boring a ϕ1.5 mm hole at the center of a material with a hardness of 10 and a ϕ1.5 mm pushing bar made of High Speed Steel were provided, and about 10 mg of ion-flow-type ionic solid ($Li_6[Zn_4O[Rh(L\text{-}cys)_3]_4].nH_2O$) (hereinafter, referred to as a Li salt fine crystal) was pressed against the jig with the pushing bar from the upper side and the lower side to prepare a pellet. The effective pressure applied to the sample was a maximum of from 1.0 to 1.1 GPa. In preparation of the pellet, pressure was applied up to about 0.3 GPa from normal pressure for about 20 minutes for removal of air, the pressure was then increased by 0.1 GPa every about 5 minutes, the sample was held at the maximum pressure for about 20 minutes, and then taken out, and wiring work was carried out. For the wiring work, a ϕ20 μm gold wire was used, and DOTITE XC-12 and D-550 manufactured by Fujikura Kasei Co. Ltd. were used as paste. The paste was appropriately diluted with diethyl succinate before use for maintaining a good contact state. (Voltage application experiment) A direct-current power-supply apparatus was connected to the pellet (device) with electrodes, and the voltage was raised from 0 V to 250 V at a rate of 25 V/sec. The sample was held for about 7 seconds, the applied voltage was then set back to 0 V, and the sample was held for about 15 seconds. An inverse voltage was similarly applied up to 250 V, and the sample was observed with a thermography. There was no temperature difference.

Example 5

For examining the relationship of formation of a temperature difference with ion flowability, crystals of a charge-separation-type ionic solid and an ion-flow-type ionic solid undergoing heavy crystal damage and having low ion flowability were observed with a thermography while a voltage was applied to the crystals. There was no temperature difference.

Alkali metal ions in the ion-flow-type ionic solid ($K_6$[$Zn_4O$[Rh(L-cys)$_3$]$_4$]·$nH_2O$) have flowability, and therefore application of a DC potential from the outside causes $K^+$ ions to move, so that the density of $K^+$ ions becomes high near the negative electrode and the density of $K^+$ ions becomes low near the positive electrode. On the other hand, the negatively charged complex has no flowability, and the position thereof does not change. It is known that when a fluid has a concentration gradient of a chemical species, the temperature at which the concentration of light particles increases rises, resulting in generation of a temperature gradient. This is called a Dufour effect. The temperature gradient under application of an electric field according to the present invention may be a temperature gradient caused by a concentration gradient similarly to the Dufour effect. When application of a voltage is stopped, the concentration gradient disappears, and the temperature difference is rapidly lost. When an inverse DC potential is applied, the temperature gradient is inverted.

Example 6

Figure 5:
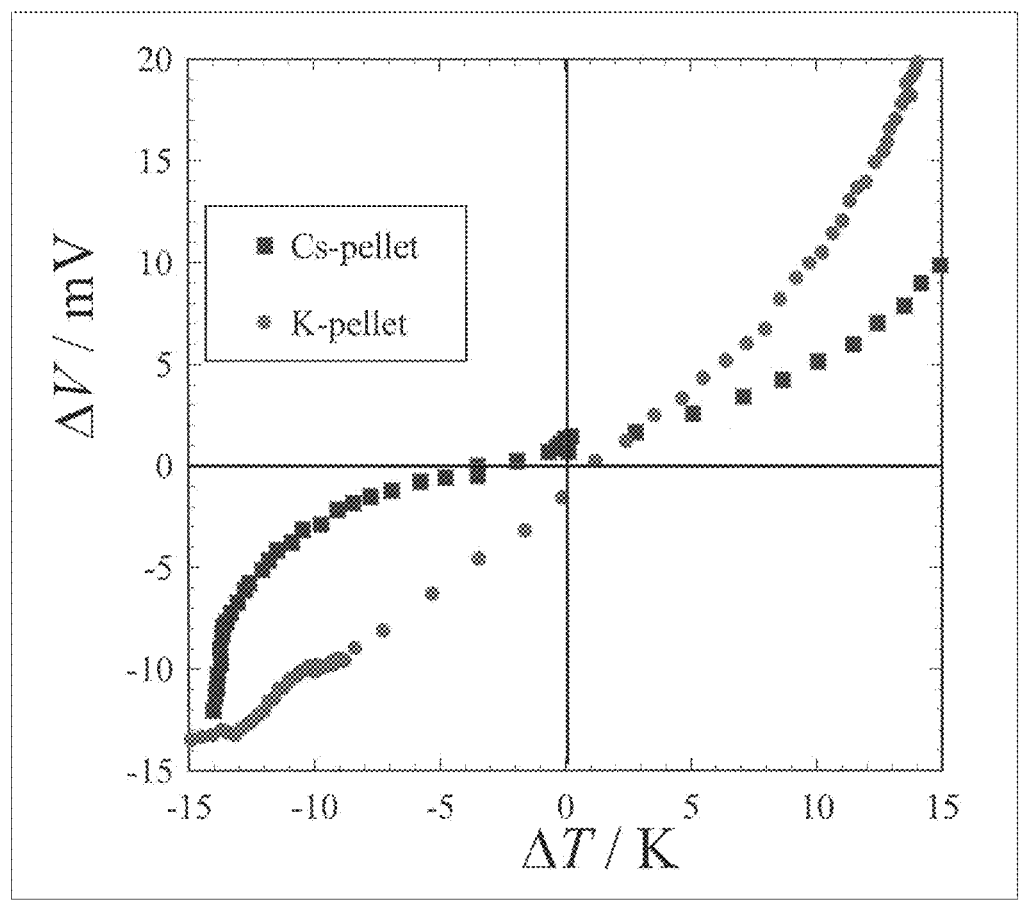
FIG. 5 shows a relationship between a voltage ($\Delta V$) by a nanovoltmeter and a temperature difference ($\Delta T$).

A jig obtained by boring a ϕ1.5 mm hole at the center of a material with a hardness of 10 and a ϕ1.5 mm pushing bar made of High Speed Steel were provided, and about 20 mg of respective ion-flow-type ionic solids ($K_6$[$Zn_4O$[Rh(L-cys)$_3$]$_4$]·$nH_2O$) (hereinafter, referred to as a K salt fine crystal) and (Cs [$Zn_4O$[Rh(L-cys)$_3$]$_4$]·$nH_2O$) (hereinafter, referred to as a Cs salt fine crystal) were pressed against the jig with the pushing bar from the upper side and the lower side to prepare a pellet. The effective pressure applied to the sample was a maximum of from 1.0 to 1.1 GPa. In preparation of the pellet, pressure was applied up to about 0.3 GPa from normal pressure for about 20 minutes for removal of air, the pressure was then increased by 0.1 GPa every about 5 minutes, the sample was held at the maximum pressure for about 20 minutes, and then taken out, and wiring work was carried out. For the wiring work, a ϕ20 μm gold wire was used, and DOTITE XC-12 and D-550 manufactured by Fujikura Kasei Co. Ltd. were used as paste. The paste was appropriately diluted with diethyl succinate before use for maintaining a good contact state. The lower part of the pellet prepared by the aforementioned method was bonded to a 0.5 mm-thick sapphire plate with conductive paste, and disposed in such a manner that the long axis direction of the pellet was perpendicular to the sapphire plate, and a sapphire plate different from the above-described sapphire plate was bonded thereto with grease to build an apparatus capable of controlling the temperature of the lower part of the pellet with an electromotive force generated only from the pellet. A thermoelectromotive force measurement experiment was conducted. Using a copper piece cooled with liquid nitrogen or heated with a high-temperature dryer, the sapphire plate was cooled and heated to change the temperature of the lower part of the pellet. The temperature of the lower part of the pellet was changed within a temperature range from −15 K to +20 K with respect to room temperature of 295 K. A change in voltage with the temperature change was measured with K2182 Nanovolt Meter manufactured by Keithley Instruments. Since the temperature of the upper end is substantially equal to room temperature, a difference between the temperature of the lower part and room temperature was set to ΔT, and a voltage ΔV changed from the background due to the temperature change was defined as an electromotive force. According to the result of the experiment shown in FIG. 5, a thermoelectromotive force of from about 0.4 mV/K to 1 mV/K was observed.

Example 7

Figure 6:
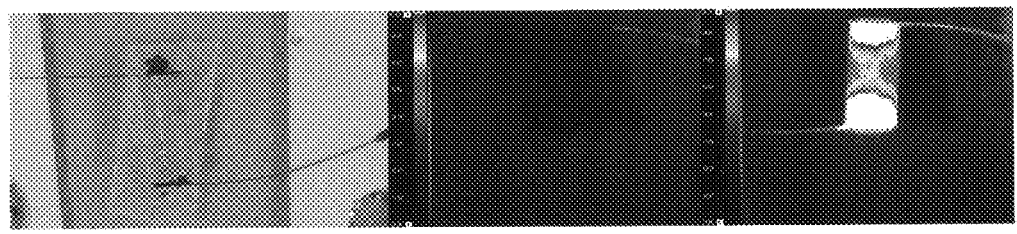
FIG. 6 shows heat generation phenomena at both electrodes after application of a voltage to a pellet containing an ionic solid according to the present invention.

In an environment with a humidity close to 100%, a RhZn-based K salt ionic solid pellet having a diameter of 1.5 mm and a length of 4 mm was prepared. When a voltage was applied, a heat generation phenomenon was observed at 7 V, and it was possible to observe heat generation at both the positive electrode (+3 K) and the negative electrode (+2.3 K) (FIG. 6). Thus, in this system, two heat generation mechanisms may be present.

Figure 7:
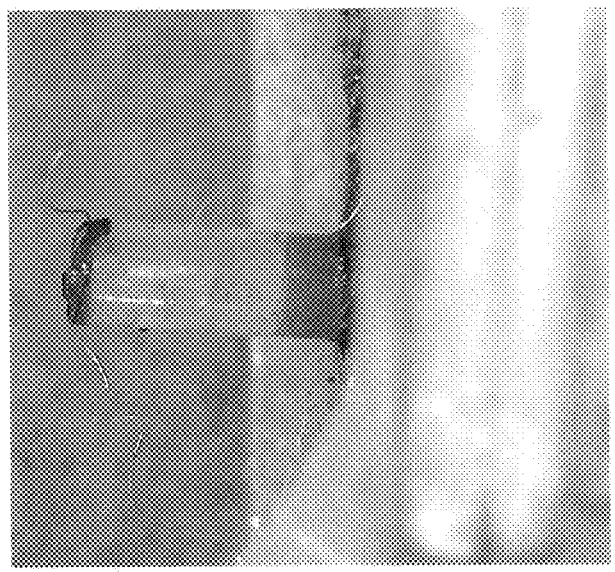
FIG. 7 shows a state in which one electrode is in contact with a copper block.
Figure 8:
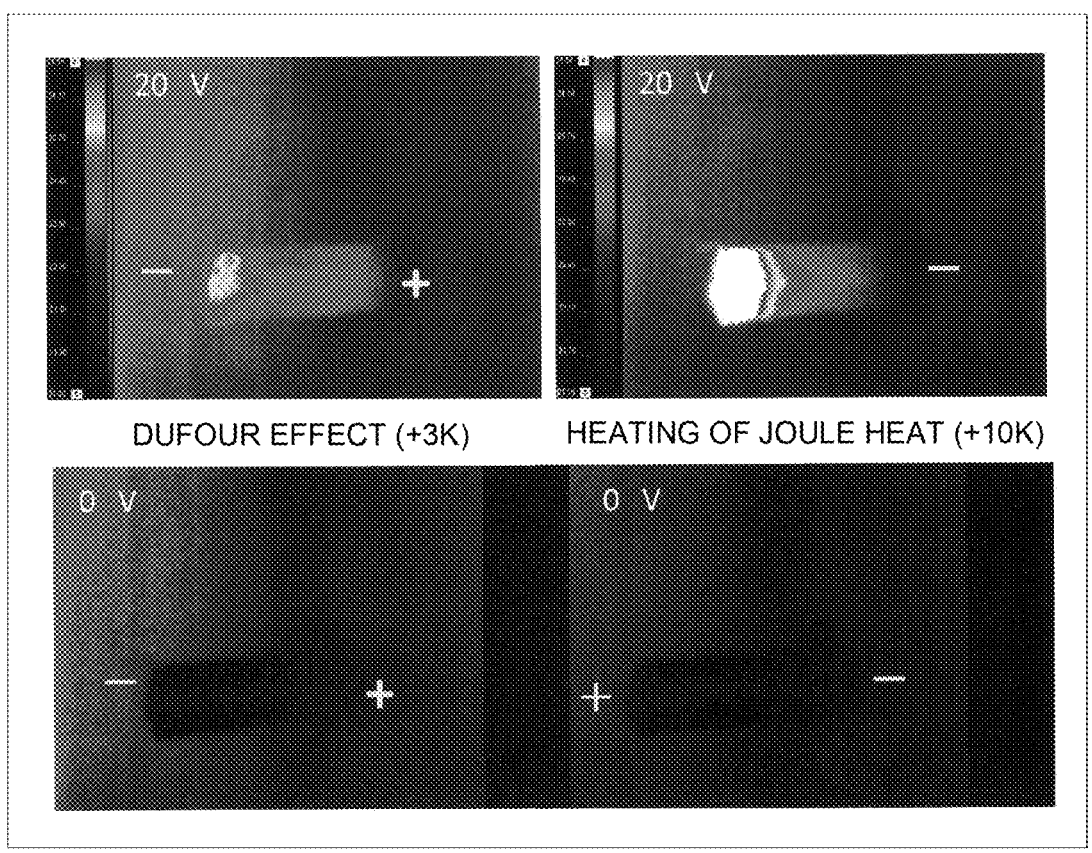
FIG. 8 shows the fact that the ionic solid according to the present invention generates both Dufour effect heat and Joule heat.

(1) For analyzing heat generation at each of the electrodes, a voltage was applied with one electrode brought into contact with a copper block to suppress heat generation as shown in FIG. 7. Measurement with a thermography was performed while a voltage of 20 V was applied at each of the electrodes. In FIG. 8, the copper block is on the right side of the pellet, and the lower picture of FIG. 8 shows a state before application of the voltage. In the upper left picture of FIG. 8, generation of Joule heat occurs at the positive electrode, and is suppressed by the copper block. On the negative electrode side, heat generation probably from the Dufour effect occurs due to the concentration of ions. When the positive/negative of the voltage was inverted, heat generation on the negative electrode side was suppressed, and only generation of Joule heat on the positive electrode side was observed (upper right picture of FIG. 8).

Figure 9:
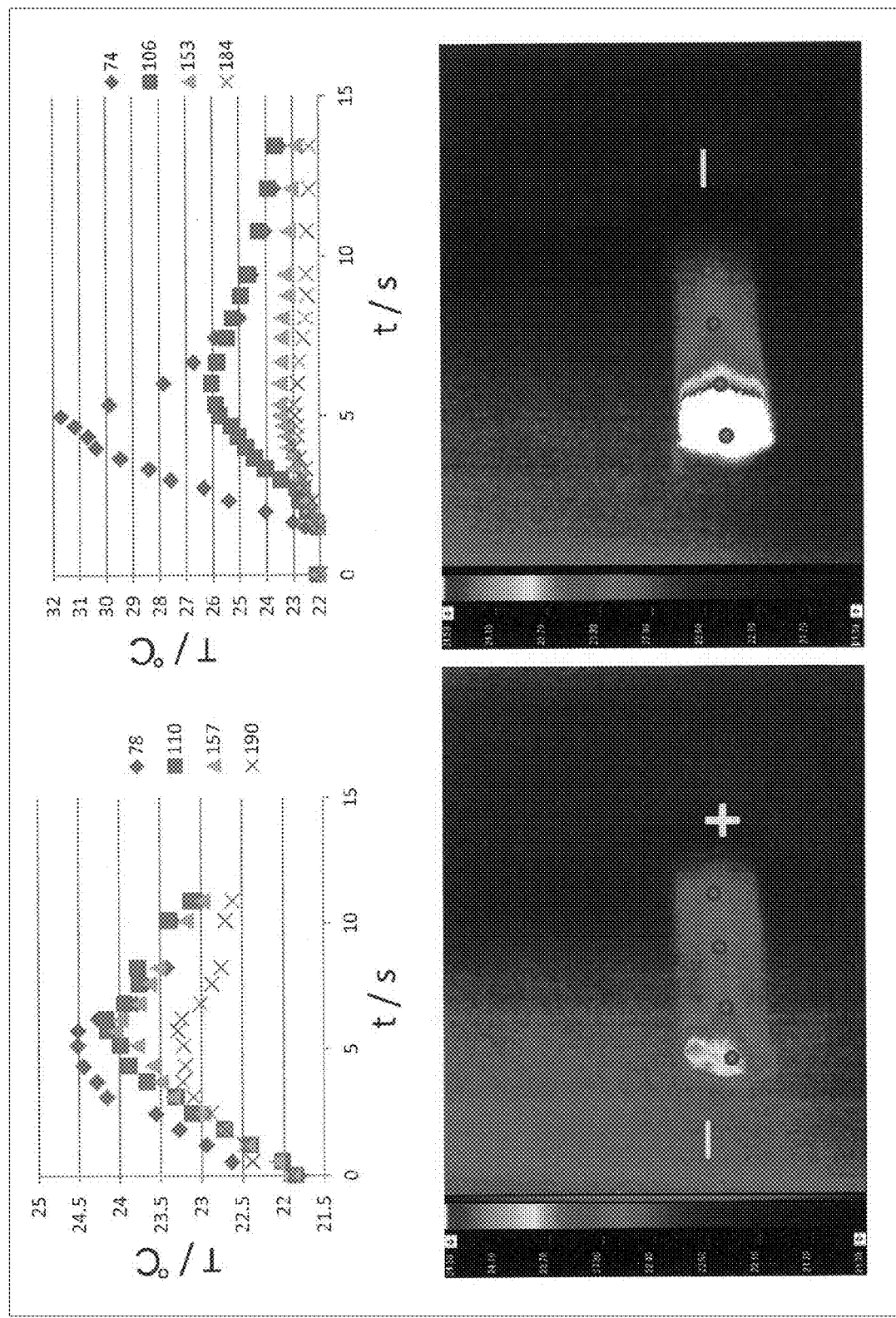
FIG. 9 shows temperature distributions of Dufour effect heat and Joule heat during application of a voltage.

(2) For examining the temperature distribution in application of the voltage, the data from the thermography was quantified, and analyzed. Points on the left picture of FIG. 9 correspond to 78, 110, 157 and 190 (X-axis pixel numbers in thermography) in this order from the left, and points on the right picture of FIG. 9 correspond to 74, 106, 153 and 184 in this order from the left. The temperature difference between both ends of the pellet is about 1.5 K in the left picture of FIG. 9, and about 10 K in the right picture of FIG. 9. The reason why there is such a marked difference may be that simple heat generation based on generation of Joule heat depends directly on the applied voltage, whereas the Dufour effect depends on the ion concentration gradient, and thus has an upper limit. This fact can also be confirmed by the finding that the value of heat generation on the negative electrode side in FIG. 6 (7 V, 2.3 K) and the value of heat generation in this experiment (20 V, 3 K) are comparative to each other, and are not proportional to the applied voltage.

Figure 10:
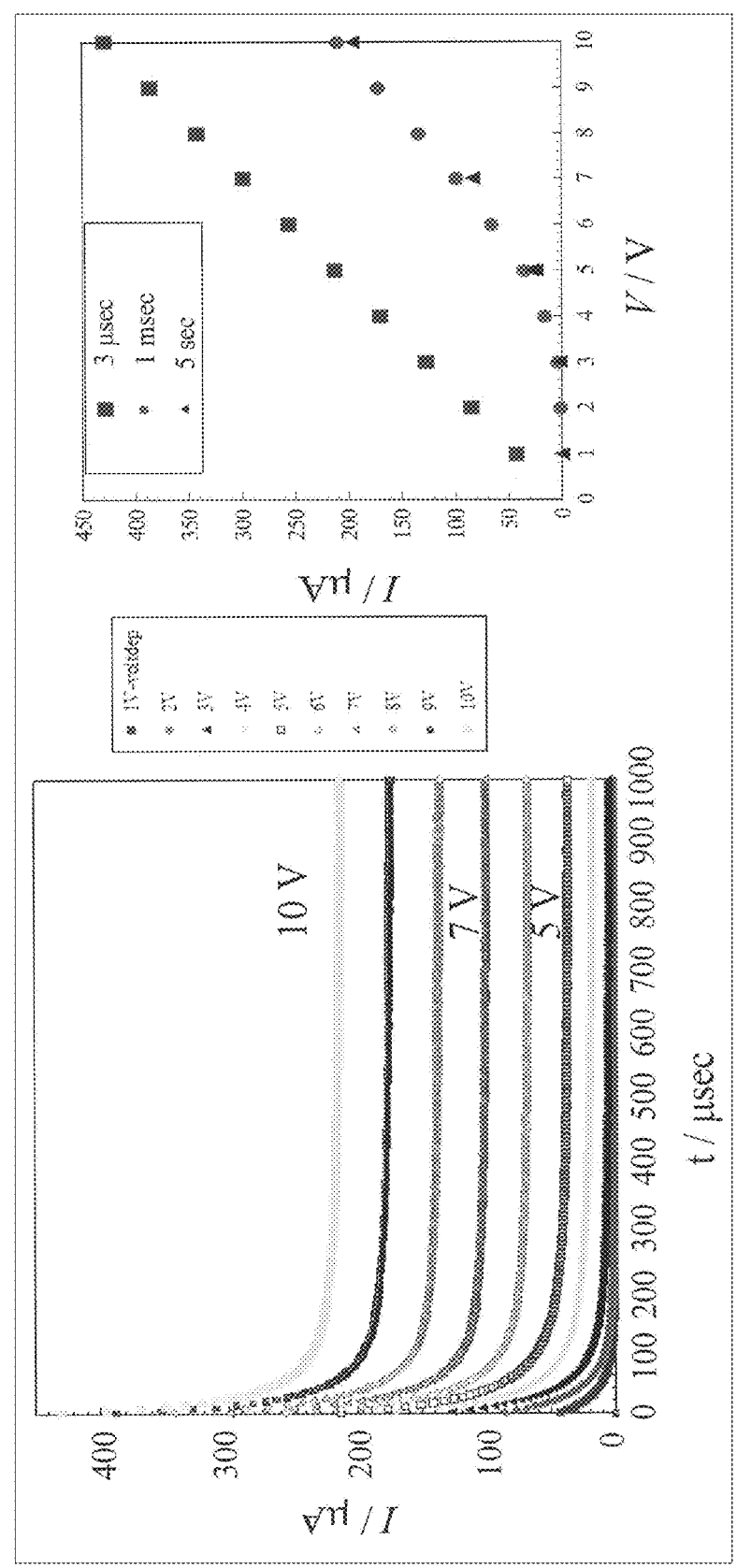
FIG. 10 shows a change in current value by application of a constant voltage to the pellet containing an ionic solid according to the present invention.

(3) A constant voltage was applied to a pellet sample prepared from a fine crystal of a RhZn-based K salt ionic solid and having a diameter of 1.5 mm and a length of 3.0 mm, and the time dependency of the current value here was measured. At 3 msec, i.e. immediately after the application, there is a linear relationship between the current value and the voltage value (FIG. 10). However, after 1 msec (right end of upper right diagram of FIG. 10) and 5 sec, a non-linear conduction property was observed in which the current value is rapidly increased by application of above a certain voltage. Thus, this ionic solid may have different properties in a low-voltage and constant-current region and a high-voltage and non-linear conduction region.

The reason why the current passes in different ways on the low-voltage side and the high-voltage side can be understood as follows. First, at a low voltage near 0 to 3 V, ions deviate in the beginning, so that cations contact electrodes, leading to passage of current in the order of microseconds. Thereafter, the current is not observed because the potential deviation is canceled by the ion concentration. However, when the potential reaches a certain level, an ion concentration difference can be generated over the entire sample. For example, when a voltage applied to a pellet of good quality with a diameter of 1.5 mm and a length of 3 mm exceeds 5 V, ion conduction occurs as in a solution, and thus substantial electric resistance decreases, so that the current passes in a non-linearly increased amount with respect to the voltage.

Example 8

In voltage application measurement, the maximum current and the maximum voltage can be separately set for preventing an overcurrent and an overvoltage. In this experiment, the applied voltage was increased with the applied current control value (compliance current value) fixed to 1.2 mA.

Figure 11:
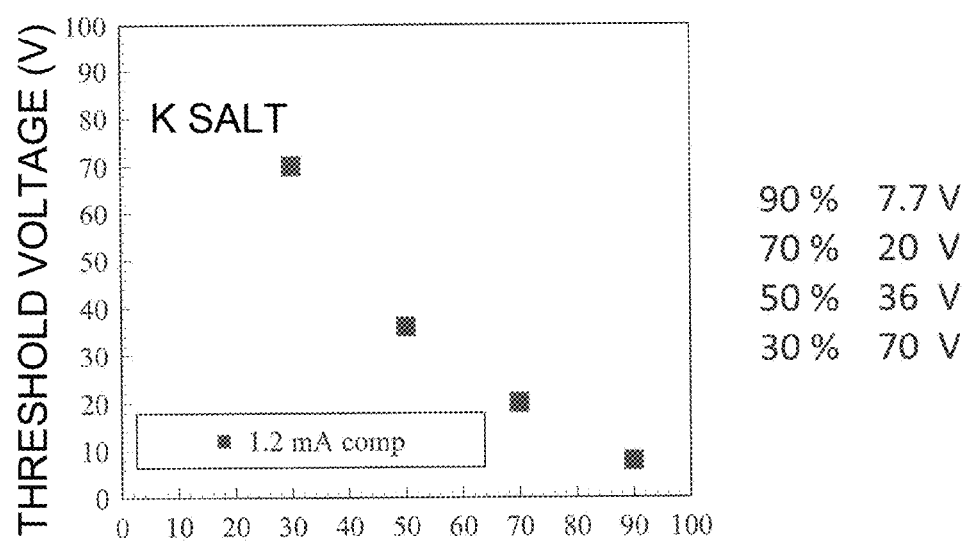
FIG. 11 shows humidity dependency of generation of heat by application of a voltage.
Figure 11:
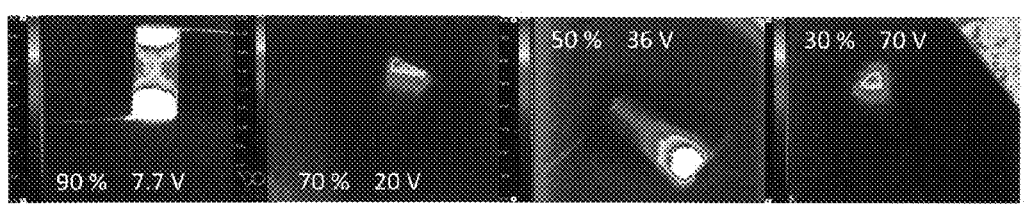

The current-voltage properties of a pellet sample prepared from a fine crystal of a RhZn-based K salt ionic solid and having a diameter of 1.5 mm and a length of from 2.5 mm to 3.0 mm include non-linear conductivity. The voltage with a current limited to 1.2 mA corresponds to a substantial voltage threshold, and also involves a temperature rise. The voltage involving a current limitation and a temperature rise correlates with a humidity during preparation of the pellet, and the driving voltage becomes low as the humidity during preparation of the pellet increases (lower picture of FIG. 11). Hence, the properties of this ionic solid may include high humidity dependency. Thus, the humidity during preparation of the pellet and the voltage value at which a current of 1.2 mA is generated are plotted in the upper diagram of FIG. 11.

When the current is constant, the threshold voltage may represent mobility of cations in the ionic solid. The mobility of ions is related to the magnitude of resistance in the ionic solid. The magnitude of resistance in the ionic solid varies depending on the size of the grain boundary and the water content in the pellet of the ionic solid.

Example 9

Figure 12:
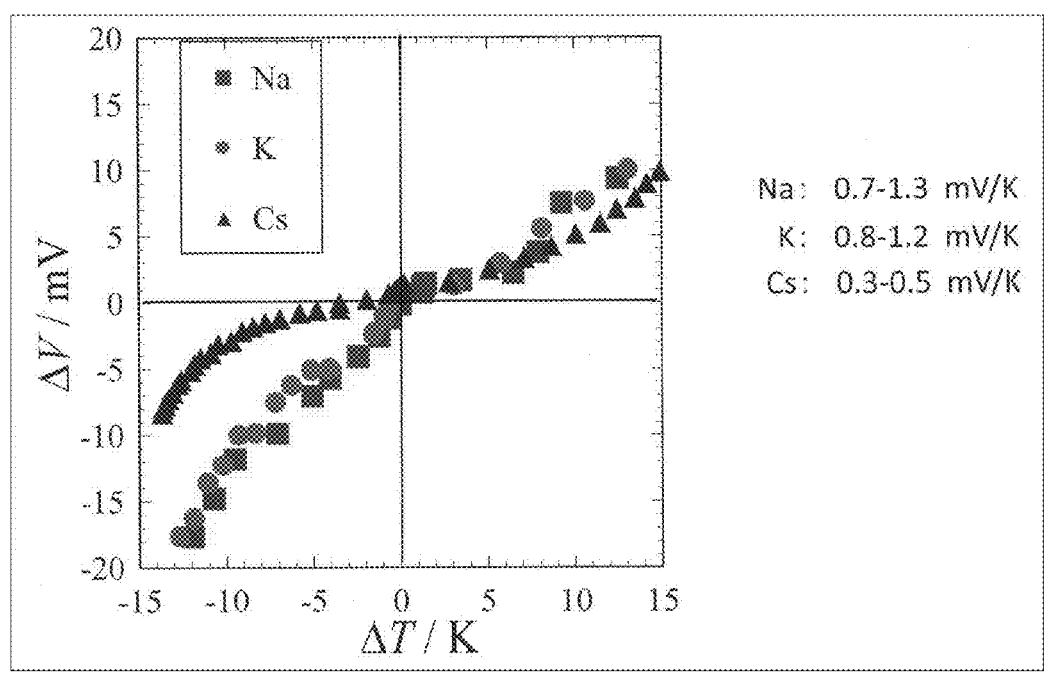
FIG. 12 shows a thermoelectromotive force of the ionic solid according to the present invention.
Figure 13:
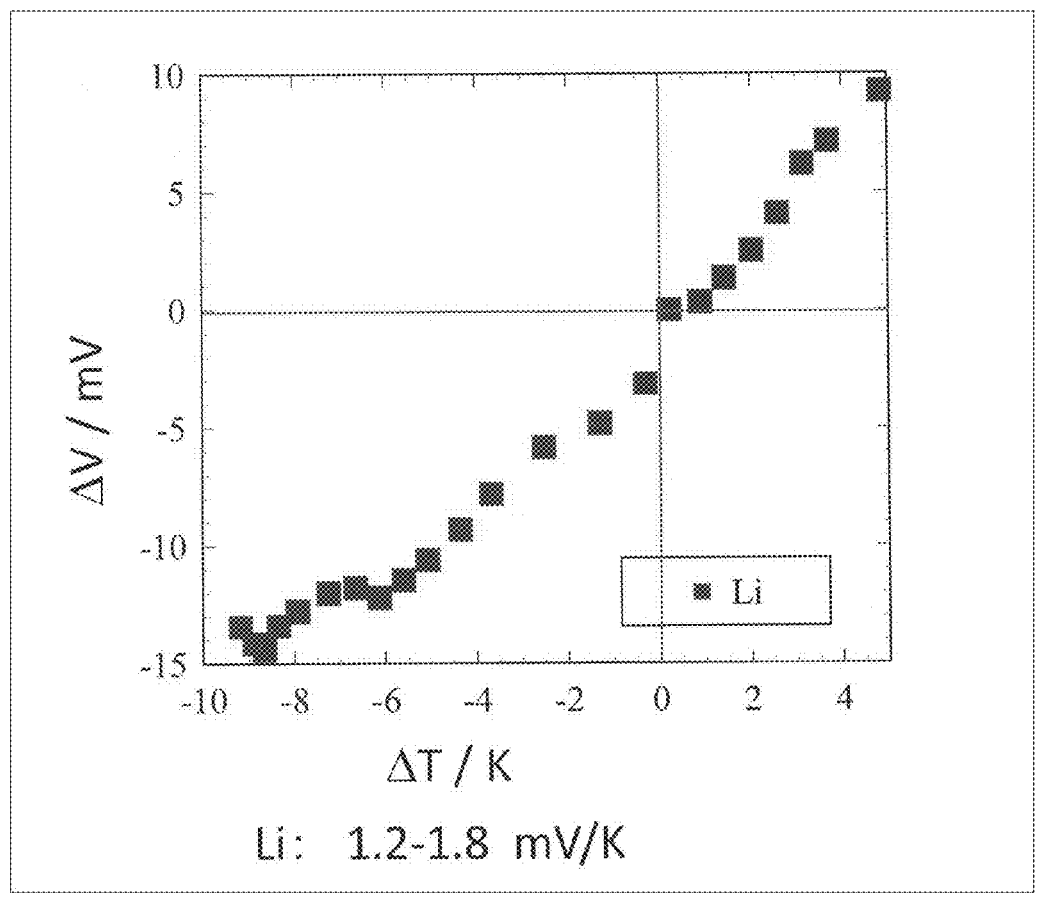
FIG. 13 shows a thermoelectromotive force of the ionic solid according to the present invention (Li salt).

The thermoelectromotive force was systematically measured for the ion-flow-type ionic solid, the RhZn-based K salt, the Na salt and the Cs salt (FIG. 12). The measurement was performed also for the Li salt, but the results thereof are plotted in isolation (FIG. 13) because the temperature at which a Li salt pellet is degraded is close to room temperature, so that data reliability at a high temperature is deteriorated.

INDUSTRIAL APPLICABILITY

The ionic solid according to the present invention is sensitively changed by an environment in which the ionic solid is placed. The ionic solid can be not only used as a humidity sensor, but also applied to recording of temperature and humidity in fine spaces, recording of temperature and humidity histories in logistics, quality assurance, and the like.

The invention claimed is:

1. A device, comprising:
    electrodes; and
    an ionic solid,
    wherein the ionic solid comprises:
        an anionic heterometal complex aggregated to form a crystal lattice; and
        a cationic species present in interstices of the crystal lattice, and
    wherein the anionic heterometal complex comprises:
        a metal M1 selected from the group consisting of an element of Group 8, 9, 10 of the Periodic Table, Cr or Mn;
        a metal M2 selected from the group consisting of an element of Group 11 or 12 of the Periodic Table; and
        a ligand.

2. The device according to claim 1, wherein the anionic heterometal complex comprises a metal M1 selected from the group consisting of an element of Group 8, 9 or 10 of the Periodic Table, and
    the metal M1 Fe, Ru, Os, Rh, Co, Pd, Ir, or Pt.

3. The device according to claim 1, wherein the metal M2 is Zn, Cd, Hg, Au, Ag or Cu.

4. The device according to claim 1, wherein the ionic solid is an ionic solid represented by formula (1):

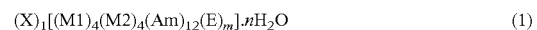

wherein M1 represents Fe, Ru, Os, Rh, Pd, Co, Ir, Pt, Cr or Mn;
    M2 represents Zn, Cd, Hg, Au, Ag or Cu;
    X represents a cation;
    Am represents an amino acid;
    E represents $O^{2-}$, $S^{2-}$, $Se^{2-}$, $Te^{2-}$, $F^-$, $Cl^-$, $Br^-$, $I^-$ or $H^-$;
    l represents a number which gives a value of from 4 to 14 when multiplied by an ionic valency of X;
    m represents a number of 0 or 1; and
    n represents a number of from 1 to 100.

5. The device according to claim 4, wherein the anionic heterometal complex in the formula (1) is a complex represented by formula (2):

wherein M1 represents Fe, Ru, Os, Rh, Co, Pd, Ir, Pt, Cr or Mn;
    M2 represents Zn, Cd, Hg, Ag or Cu;
    Am represents an amino acid;
    E represents $O^{2-}$, $S^{2-}$, $Se^{2-}$, $Te^{2-}$, $F^-$, $Cl^-$, $Br^-$, $I^-$ or $H^-$;
    l represents a number which gives a value of from 4 to 14 when multiplied by the ionic valency of X in the formula (1); and
    m represents a number of 0 or 1.

6. The device according to claim 4, wherein Am is an amino acid having a thiol group.

7. The device according to claim 4, wherein X is a cation of a metal belonging to Group 1 or Group 2.

8. The device according to claim 4, wherein M1 represents Rh or Co, and M2 represents Ag or Zn.

9. The device according to claim 4, wherein Am is an amino acid selected from the group consisting of cysteine, penicillamine and homocysteine.

10. The device according to claim 1, wherein the device is an electrothermal device.

11. The device according to claim 1, wherein the device is a device in which when a potential difference is applied to the device, a flowable ion concentration gradient is generated in the ionic solid, resulting in generation of a temperature distribution in the ionic solid.

12. The device according to claim 1, wherein the device is a device in which when a change in amount of heat is applied to the device, a flowable ion concentration gradient is generated in the ionic solid, resulting in generation of a potential difference in the ionic solid.

13. A method, comprising:
passing a current through the device of claim 1,
generating a concentration gradient in the ionic solid of the device, and
generating heat in the ionic solid of the device.

* * * * *